United States Patent
Ahn et al.

(10) Patent No.: US 8,541,857 B2
(45) Date of Patent: Sep. 24, 2013

(54) BACKSIDE ILLUMINATION CMOS IMAGE SENSORS AND METHODS OF MANUFACTURING THE SAME

(75) Inventors: Jung-chak Ahn, Yongin-si (KR); Kyung-ho Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 132 days.

(21) Appl. No.: 12/984,404

(22) Filed: Jan. 4, 2011

(65) Prior Publication Data

US 2011/0193147 A1 Aug. 11, 2011

(30) Foreign Application Priority Data

Feb. 5, 2010 (KR) .................... 10-2010-0011180

(51) Int. Cl.
*H01L 31/18* (2006.01)

(52) U.S. Cl.
USPC ........... 257/432; 257/434; 257/460; 257/466; 257/E31.127; 348/302

(58) Field of Classification Search
USPC .................. 257/432, 434, 460, 466, E31.127; 348/302
See application file for complete search history.

(56) References Cited

U.S. PATENT DOCUMENTS

| | | | | |
|---|---|---|---|---|
| 5,595,930 | A * | 1/1997 | Baek | 438/60 |
| 6,781,211 | B2 * | 8/2004 | Kang et al. | 257/436 |
| 7,183,598 | B2 * | 2/2007 | Fan et al. | 257/288 |
| 7,683,302 | B2 * | 3/2010 | Yokozawa | 250/208.1 |
| 8,395,686 | B2 * | 3/2013 | Tatani et al. | 348/302 |
| 2010/0155868 | A1 * | 6/2010 | Jang | 257/432 |
| 2010/0176474 | A1 * | 7/2010 | Kwon et al. | 257/432 |

FOREIGN PATENT DOCUMENTS

| | | |
|---|---|---|
| KR | 10-0172849 | 10/1998 |
| KR | 10-0329770 | 5/2002 |
| KR | 10-2008-0010163 | 1/2008 |
| KR | 10-0868629 | 11/2008 |

* cited by examiner

*Primary Examiner* — Michael Shingleton
(74) *Attorney, Agent, or Firm* — Harness, Dickey & Pierce, P.L.C.

(57) ABSTRACT

Backside illumination CMOS image sensors having convex light-receiving faces and methods of manufacturing the same. A backside illumination CMOS image sensor includes a metal layer, an insulating layer and a photodiode. The insulating layer is on the metal layer. The photodiode is on the insulating layer, and a top face of the photodiode, which receives light, is curved. A method of manufacturing a backside illumination CMOS image sensor including a photodiode having a convex surface includes forming an island smaller than the photodiode on a portion of a light-receiving face of the photodiode, and annealing the island to form the photodiode having the convex light-receiving face.

8 Claims, 6 Drawing Sheets

BACKSIDE ILLUMINATION CMOS IMAGE SENSORS AND METHODS OF MANUFACTURING THE SAME

CROSS-REFERENCE TO RELATED APPLICATIONS

This application claims priority under 35 U.S.C. §119 to Korean Patent Application No. 10-2010-0011180, filed on Feb. 5, 2010, in the Korean Intellectual Property Office (KIPO), the entire contents of which is incorporated herein by reference.

BACKGROUND

1. Field

Example embodiments of the inventive concepts relate to backside illumination CMOS image sensors, and more particularly, to backside illumination CMOS sensors including photodiodes with convex light-receiving surfaces and methods of manufacturing the same.

2. Description of the Related Art

A CMOS image sensor may include a plurality of unit pixel elements (pixels) that convert a sensed image into an electric signal. Each unit pixel may include a photo-diode that senses an input image signal and a plurality of MOS transistors that may be used to convert the sensed image signal into an electric signal. Light may be received by the image sensor through a top surface of a chip including photo-diodes and MOS transistors formed thereon. Because a unit pixel includes not only the photodiode but also the MOS transistors, only a part of the unit pixel may be allocated to the light-receiving area of the photodiode.

A backside illumination CMOS image sensor may receive light through a bottom surface of a chip (e.g., a substrate). This backside illumination CMOS image sensor may be manufactured in such a manner that photodiodes and MOS transistors constituting the backside illumination CMOS image sensor are formed, the bottom face of the chip is ground to a thickness most suitable for receiving light, and a color filter and a micro-lens are formed on the ground bottom face.

SUMMARY

Example embodiments of inventive concepts may provide backside illumination CMOS image sensors which refract incident photons to the center of a photodiode and methods of manufacturing the same.

According to an example embodiment of the inventive concepts, there are provided backside illumination CMOS image sensors including a metal layer, an insulating layer and a photodiode. The insulating layer may be formed on the metal layer. The photodiode may be formed on the insulating layer, and the top face of the photodiode, which receives light, has a predetermined curvature.

According to another example embodiment of the inventive concepts, there are provided backside illumination CMOS image sensors including one or more metal layers, at least one inter-metal dielectric, an interlayer dielectric, and a photodiode.

The at least one inter-metal dielectric may be formed between the one or more metal layers. The interlayer dielectric may be formed on the one or more metal layers. The photodiode may be formed on the interlayer dielectric. The top face of the photodiode, which receives light may be convex to the direction in which the light is received.

According to another example embodiment of the inventive concepts there are provided methods of manufacturing backside illumination CMOS image sensors including a photodiode having a convex light-receiving face, which includes forming an island smaller than the photodiode on a predetermined portion of the light-receiving face of the photodiode, and annealing the island to form the photodiode having the convex light-receiving face.

According to another example embodiment of the inventive concepts, a backside illumination CMOS image sensor includes a plurality of metal layers, at least one inter-metal dielectric between the plurality of metal layers, an interlayer dielectric on the plurality of metal layers and a photodiode with a convex surface on the interlayer dielectric, the convex surface on an opposite side of the photodiode from the interlayer dielectric.

According to another example embodiment of the inventive concepts, a backside illumination CMOS image sensor includes a conductive layer, an insulating layer on the conductive layer and a photodiode with at least one curved surface on the insulating layer.

BRIEF DESCRIPTION OF THE DRAWINGS

Example embodiments will be more clearly understood from the following brief description taken in conjunction with the accompanying drawings. FIGS. 1-10 represent non-limiting, example embodiments as described herein.

These figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These teams are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments of the inventive concepts may include a photodiode with a curved light-receiving face. When photons corresponding to light are input to the photodiode, the photons may be refracted and focused onto the center of the photodiode. Since most of the input photons may be refracted and focused onto the center of the photodiode, relatively few photons may fall on or proximally to a neighbouring photodiode. Photons falling on or proximally to a neighbouring photodiode may be transferred to the neighbouring photodiode and erroneously transformed into an electric signal. Erroneous generation of electric signals in neighbouring photodiodes may be called cross-talk. If cross-talk occurs a correct image signal may not be generated.

Figure 1:
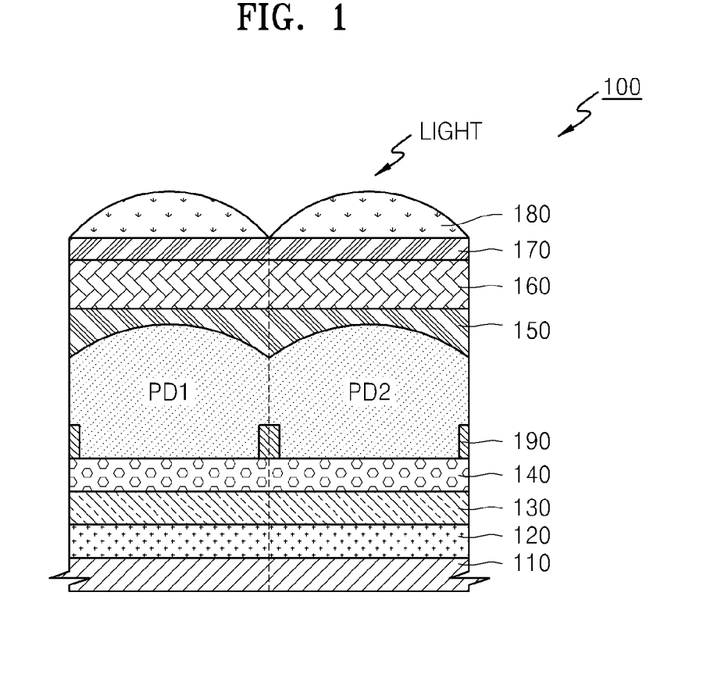
FIG. 1 is a cross-sectional diagram illustrating a stacked structure of backside illumination CMOS image sensors according to example embodiments of the inventive concepts.

FIG. 1 is a cross-sectional diagram illustrating a stacked structure of backside illumination CMOS image sensors according to example embodiments of the inventive concepts. FIG. 1 illustrates two of a plurality of unit pixels of a backside illumination CMOS image sensor 100. Referring to FIG. 1, a unit pixel may include a second conductive layer 110, an inter-level dielectric 120 on the second conductive layer 110, a first conductive layer 130 on the inter-level dielectric 120 and an interlayer dielectric 140 on the first conductive layer 130. Photodiodes PD1 and PD2 may be on the interlayer dielectric 140. Light-receiving surfaces of the photodiodes PD1 and PD2 may be curved while surfaces of the photodiodes PD1 and PD2, which are on the interlayer dielectric 140, may be flat. A first planarization layer 150 may be on the photodiodes PD1 and PD2, a color filter 160 may be on the first planarization layer 150, a second planarization layer 170 may be on the color filter and a micro-lens 180 may be on the second planarization layer 170. The photodiodes PD1 and PD2 may be isolated from each other according to an isolating material 190. The first conductive layer 130 and the second conductive layer 110 may be, for example, a metal.

Figure 2:
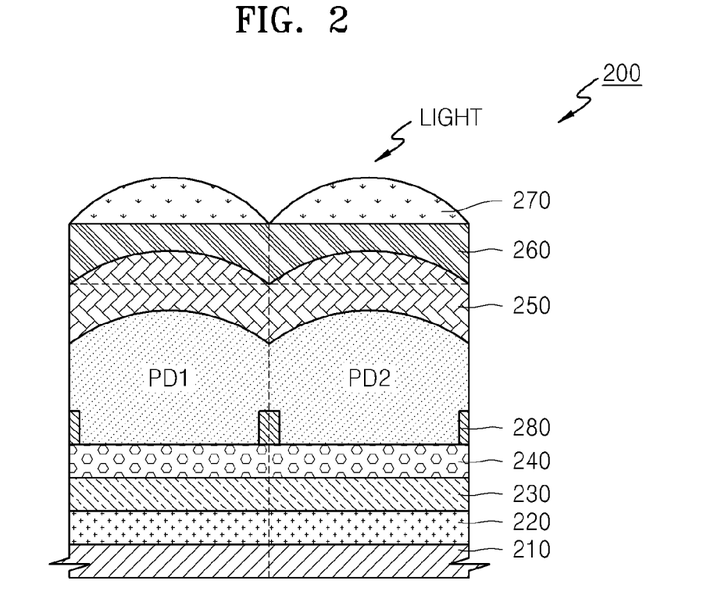
FIG. 2 is a cross-sectional diagram illustrating a stacked structure of backside illumination CMOS image sensors according to example embodiments of the inventive concepts.

FIG. 2 is a cross-sectional diagram illustrating a stacked structure of backside illumination CMOS image sensors according to example embodiments of the inventive concepts. FIG. 2 illustrates two of a plurality of unit pixels of a backside illumination CMOS image sensor 200. Referring to FIG. 2, a unit pixel may include a second conductive layer 210, an inter-level dielectric 220 on the second conductive layer 210, a first conductive layer 230 on the inter-level dielectric 220 and an interlayer dielectric 240 on the first conductive layer 230. Photodiodes PD1 and PD2 may be on the interlayer dielectric 240. Light-receiving surfaces of the photodiodes PD1 and PD2 may be curved while surfaces of the photodiodes PD1 and PD2, which are on the interlayer dielectric 240, may be flat. A color filter 250 may be on the photodiodes PD1 and PD2, a planarization layer 260 may be on the color filter 250 and a micro-lens 270 may be on the first planarization layer 260. The photodiodes PD1 and PD2 may be isolated from each other by an isolating material 280.

A dash line in the color filter 250 illustrates example embodiments of a color filter with a flat surface. The top and bottom surfaces of the color filter 250 may be curved and/or the top surface of the color filter 250 may be flat while the bottom surface of the color filter 250 may be curved. Other combinations are possible and example embodiments are not limited thereto. A curvature of the color filter 250 of the backside illumination CMOS image sensor 200 illustrated in FIG. 2 may be, for example, the same as a curvature of a surface of the photodiodes PD1 and PD2 under the color filter 250 while a surface of the color filter 160 of the backside illumination CMOS image sensor 100 illustrated in FIG. 1 may be a flat surface. The backside illumination CMOS image sensor 200 illustrated in FIG. 2 may include a single planarization layer 260 while the backside illumination CMOS image sensor 100 illustrated in FIG. 1 may include first and second planarization layers 150 and 170. The backside illumination CMOS image sensors 100 and 200 illustrated in FIGS. 1 and 2 may be formed, for example, according two different methods of manufacturing CMOS image sensors.

Photodiodes and MOS transistors may be formed on a first side of a substrate (e.g., a wafer), as well as metal layers for electrically connecting the photodiodes and the MOS transistors. For example, the photodiodes PD1 and P2, the interlayer dielectric layers 140 and 240, the first metal layers 130 and 230, the inter-metal dielectrics 120 and 220, and the second metal layers 110 and 210 among the plurality of layers of the backside illumination CMOS image sensors 100 and 200 illustrated in FIGS. 1 and 2 may be formed on the first side of the substrate. A second side of the substrate may be ground to a desired thickness. The planarization layers 150 and 260, the color filters 160 and 250 and the micro-lenses 180 and 270 may be formed on the ground face of the second side of the substrate.

Figure 3:
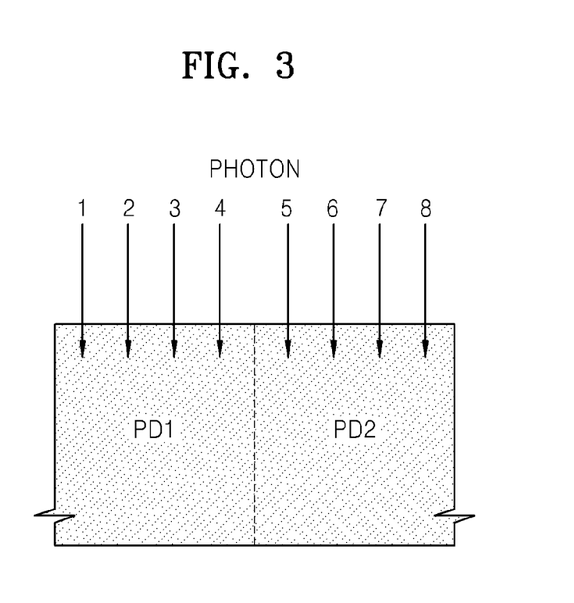
FIG. 3 is a cross-sectional diagram illustrating photodiodes with flat light-receiving surfaces.

FIG. 3 is a cross-sectional diagram illustrating photodiodes PD1 and PD2 with flat light-receiving surfaces. Referring to FIG. 3, because the light-receiving surfaces of the photodiodes PD1 and PD2 may be flat, the direction of photons incident to the photodiodes PD1 and PD2 may correspond to the direction in which the photons travel inside the photodiodes PD1 and PD2. If light is represented by photons, FIG. 3 illustrates eight photons 1-8 which are input to the photodiodes PD1 and PD2. Four of the eight photons may be input to the photodiode PD1 and the other four photons may be input to the photodiode PD2. Two photons 4 and 5 may be near a boundary (dash line of FIG. 3) of the photodiodes PD1 and PD2. Either of the two photons 4 and 5 may move to their neighboring photodiodes while the photons are transformed into an electric signal and may cause cross-talk.

Figure 4:
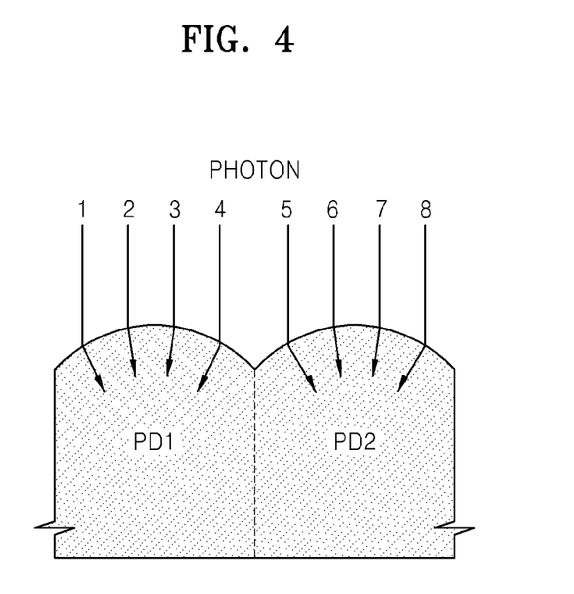
FIG. 4 is a cross-sectional diagram illustrating photodiodes including convex light-receiving surfaces.

FIG. 4 is a cross-sectional diagram illustrating photodiodes including convex light-receiving surfaces. Referring to FIG. 4, the light-receiving surfaces of the photodiodes PD1 and PD2 may be curved and incident photons may travel towards centers of the photodiodes PD1 and PD2 irrespective of the incident direction of the photons. Photons 1, 2, 3 and 4 among the eight photons may be input to the photodiode PD1 and the photons 5, 6, 7, and 8 may be input to the photodiode PD2. The photons 4 and 5 may be respectively focused to the centers of the photodiodes PD1 and PD2. The photons 4 and 5 may not be easily moved to neighboring photodiodes while the photons are transformed into an electric signal.

Figure 5:
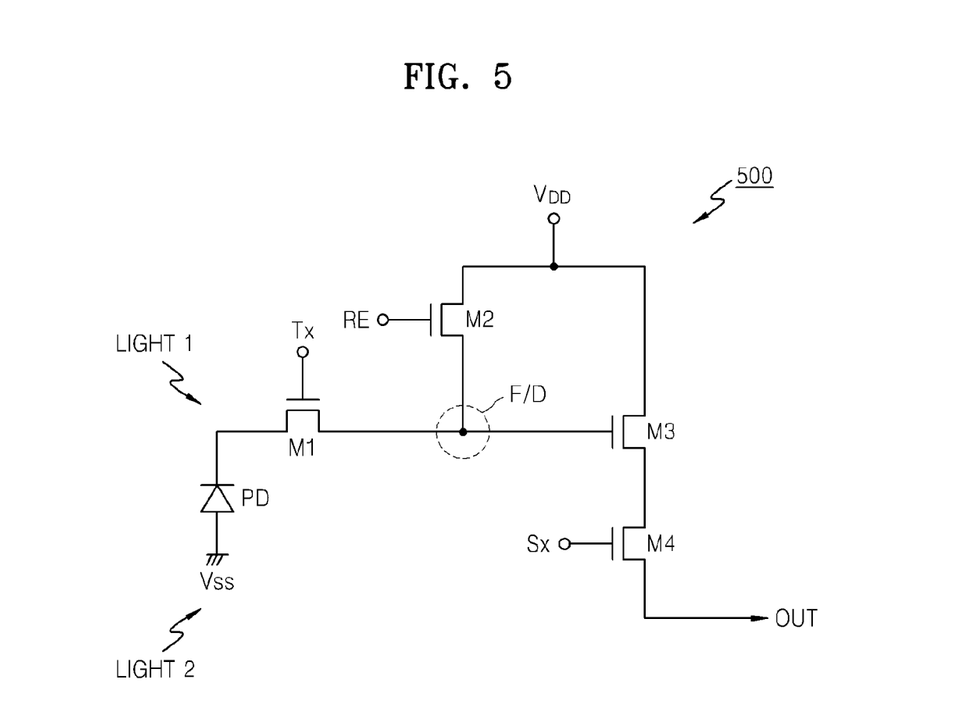
FIG. 5 is a circuit diagram of a unit pixel of a CMOS image sensor according to example embodiments of the inventive concepts.

FIG. 5 is a circuit diagram of a unit pixel of a CMOS image sensor according to example embodiments of the inventive concepts. Referring to FIG. 5, a unit pixel 500 may include a photodiode PD for sensing light, a transfer transistor M1 for transferring photons focused on the photodiode PD to a floating diffusion region F/D, a reset transistor M2 for resetting the floating diffusion region F/D, a converting transistor M3 for generating an electric signal corresponding to the photons transferred to the floating diffusion region F/D, and a select transistor M4 for transmitting the electric signal to an external device. A power supply $V_{DD}$ may be connected between the reset transistor M2 and the converting transistor M3. A power supply $V_{SS}$ may be connected to the photodiode PD.

The operations of the transfer transistor M1, the reset transistor M2, and the select transistor M4 may be respectively controlled by a transfer control signal Tx, a reset control signal RE and a select control signal Sx. A backside illumination CMOS image sensor may be discriminated from a conventional CMOS image sensor according to a direction in which light is received. The backside illumination CMOS image sensor may receive light LIGHT2 input to a P-type electrode of the photodiode PD while the conventional CMOS image sensor may receive light LIGHT1 input to an N-type electrode of the photodiode PD. In a conventional CMOS image sensor, incident light of a unit pixel may be blocked from being input to a photodiode by a MOS transistor. A backside illumination CMOS image sensor may receive light through the entire unit pixel and a light receiving efficiency of the backside illumination CMOS image sensor may be higher than that of the conventional CMOS image sensor.

Figure 6:
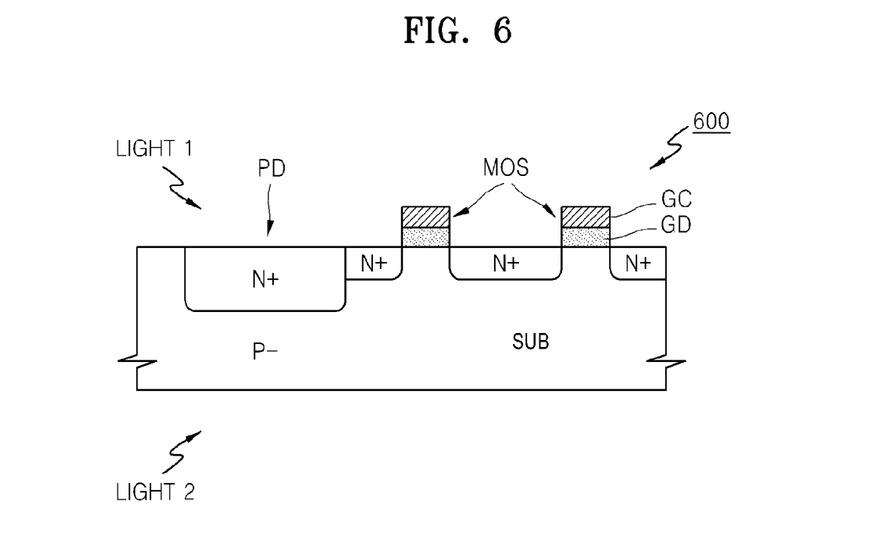
FIG. 6 is a cross-sectional diagram of a unit pixel.

FIG. 6 is a cross-sectional view of a unit pixel 600. Referring to FIG. 6, the unit pixel 600 may include a photodiode PD and MOS transistors MOS on a P-type substrate SUB. The unit pixel may be formed according to, for example, a CMOS process. A first electrode of the photodiode PD may correspond to the substrate SUB and a second electrode of the photodiode PD may correspond to an N+ type diffusion region. A MOS transistor MOS may be operated by applying a signal to a gate between two N+ type diffusion regions. The gate may include, for example, a gate dielectric GD (e.g., $SiO_2$) and a gate conductive film GC (e.g., polysilicon) stacked on the substrate SUB. An area of the photodiode PD which may receive light LIGHT2 when the light LIGHT2 is input to the P⁻ substrate SUB of the photodiode PD may be greater than the area of the photodiode PD which may receive light LIGHT1 when the light LIGHT1 is input to the N+ type diffusion region of the photodiode PD. A backside illumination CMOS image sensor according to example embodiments of the inventive concepts may receive light input to the P⁻ substrate SUB of the photodiode PD.

Figure 7:
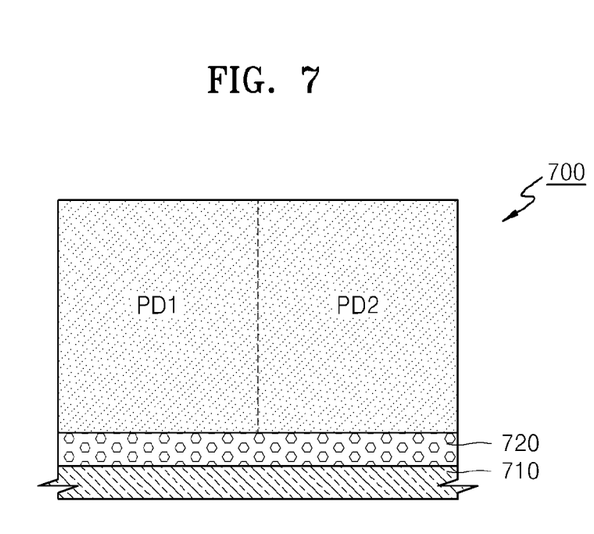
FIGS. 7-9 are cross-sectional diagrams illustrating methods of manufacturing a photodiode and a MOS transistor according to example embodiments of the inventive concepts.
Figure 8:
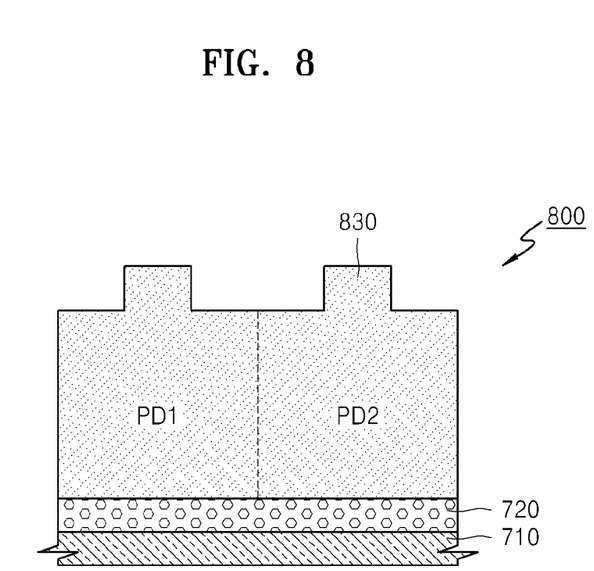
Figure 9:
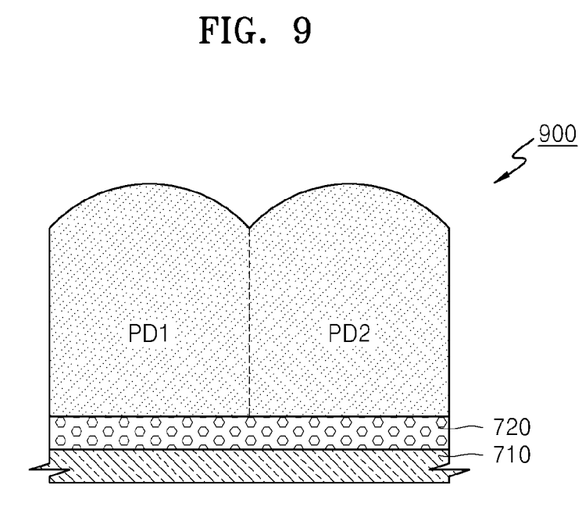

FIGS. 7-9 are cross-sectional diagrams illustrating methods of manufacturing a photodiode and a MOS transistor according to example embodiments. FIG. 7 illustrates the unit pixel 700 including photodiode PD2 and a MOS transistor formed on a wafer when the wafer is turned upside down. Referring to FIG. 7, the photodiode PD2 corresponding to the lowest layer during a process of forming the unit pixel 700 is illustrated as the top layer and a conductive layer 710 corresponding to the top layer during a process of forming the unit pixel 700 is illustrated as the lowest layer. The interlayer dielectric 720 may separate a substrate that acts as an electrode of the photodiode from the conductive layer 710. The substrate surface on which the electrode of the photodiode is formed may be ground after the photodiode and the MOS transistor are formed to adjust a width of a terminal of the photodiode. The grinding depth may be adjusted for a process selected to form an island.

FIG. 8 is a cross-sectional diagram of a unit pixel 800 illustrating island 830 formed on photodiode PD2. Referring to FIG. 8, the unit pixel 800 may include an island 830 that is smaller than the area of the substrate that acts as an electrode of the photodiode PD2. The island 830 may be formed for each unit pixel 800 and the size of the island 830 may vary according to subsequent processing. The shape of the island 830 may correspond to the shape of the unit pixel 800 and be scaled down from the shape of the unit pixel 800. For example, the island 830 may have a rectangular shape if the unit pixel 800 has a rectangular shape and may have a hexagonal or octagonal shape if the unit pixel 800 has a hexagonal or octagonal shape. Furthermore, the island 830 may have a circular shape. The shape of the island 830 is not limited. The island 830 according to example embodiments of the inventive concepts may be manufactured by forming a mask defining the island 830. For example, the island 830 may be defined by a lithography process in which photoresist remains over a portion of the photodiodes PD1 and PD2 where the island 830 is to be formed. The island 830 (e.g., a silicon island) may be formed using an etch process to etch the substrate in areas where no photoresist is present.

FIG. 9 is a cross-sectional diagram of a unit pixel 900 illustrating a result of a thermal process. For example, heat may be applied to the island 830 formed on the photodiode PD2 such that the light-receiving surface of the photodiode is curved. The unit pixel 900 may be formed by applying heat to the island 830 such that the light receiving surface of the photodiodes PD1 and PD2 are curved.

Figure 10:
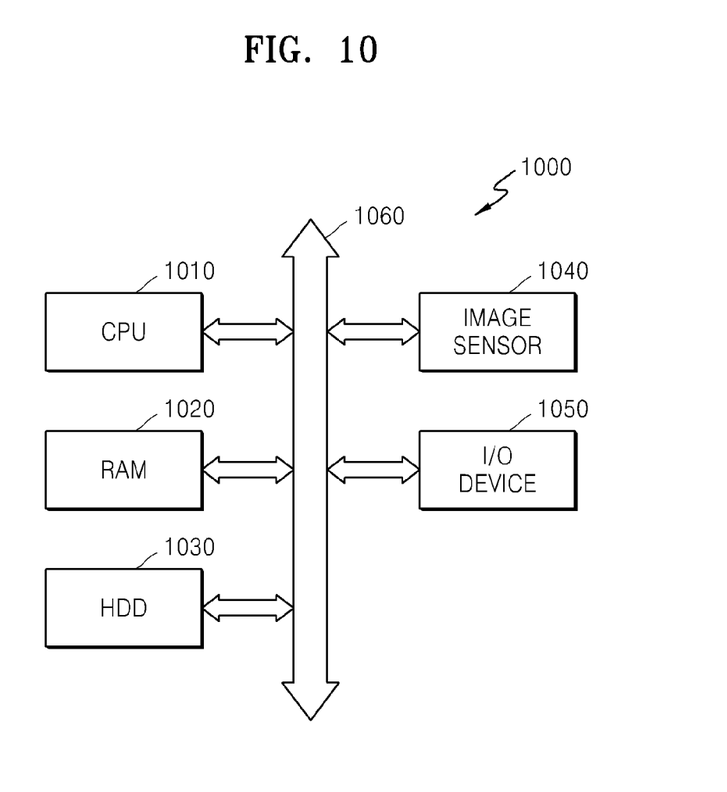
FIG. 10 is a block diagram illustrating a processor-based system including a backside illumination CMOS image sensor according to example embodiments.

FIG. 10 is a block diagram schematically illustrating a processor-based system 1000 that includes a backside illumination CMOS image sensor 1040. Referring to FIG. 16, the processor-based system 1000 may include a processor (CPU) 1010, a random access memory (RAM) 1020, a hard drive (HDD) 1030, a backside illumination CMOS image sensor 1040 and an input/output (I/O) device 1050 which may communicate with one another via a bus 1060. The backside illumination CMOS image sensor 1040 may be one of the image sensors described above with reference to FIGS. 1-9. The backside illumination CMOS image sensor 1040 may receive a control signal and/or data from the processor 1010 and/or the other elements of the processor-based system 1000. The backside illumination CMOS image sensor 1040 may supply a signal that defines an image based on the control signal and/or the data to the processor 1010. The processor 1010 may process the signal received from the backside illumination CMOS image sensor 1040.

Examples of the processor-based system 1000 may include, for example, a digital circuit, a computer system, a camera system, a scanner, a video telephone, an electronic surveillance system, a vehicle navigation system, an automatic focus system, a star tracker system, a movement detection system, an image stabilization system, a data compression system, and/or other various systems that may include a backside illumination CMOS image sensor according to example embodiments.

While example embodiments of the inventive concepts have been particularly shown and described, it will be understood by one of ordinary skill in the art that variations in form and detail may be made therein without departing from the spirit and scope of the claims.

What is claimed is:

1. A backside illumination CMOS image sensor, comprising:
    a conductive layer;
    an insulating layer on the conductive layer;
    a photodiode with at least one curved surface on the insulating layer, the at least one curved surface of the photodiode having a curvature such that light incident to an outer portion of the photodiode is focused to a center portion of the photodiode;
    a color filter on the photodiode, a surface of the color filter farthest from the photodiode being curved; and
    a micro-lens on the color filter.

2. The backside illumination CMOS image sensor of claim 1, wherein the at least one curved surface of the photodiode is a convex surface, and
    the photodiode is configured to receive light through the convex surface.

3. The backside illumination CMOS image sensor of claim 1, wherein a curvature of the surface of the color filter corresponds to the curvature of the at least one curved surface of the photodiode.

4. The backside illumination CMOS image sensor of claim 1, further comprising:
    a planarization layer between the color filter and the micro-lens.

5. A backside illumination CMOS image sensor, comprising:
    a plurality of metal layers;
    at least one inter-metal dielectric between the plurality of metal layers;
    an interlayer dielectric on the plurality of metal layers;
    a photodiode with a convex surface on the interlayer dielectric, the convex surface on an opposite side of the photodiode from the interlayer dielectric, the at least one curved surface of the photodiode having a curvature such that light incident to an outer portion of the photodiode is focused to a center portion of the photodiode;
    a color filter on the photodiode, a surface of the color filter farthest from the photodiode being curved; and
    a micro-lens on the color filter.

6. The backside illumination CMOS image sensor of claim 5, further comprising:
    a planarization layer between the color filter and the micro-lens.

7. A method of manufacturing the backside illumination CMOS image sensor of claim 5, the method comprising:
    forming an island smaller than the photodiode on the opposite side of the photodiode; and
    annealing the island to form the photodiode with the convex surface.

8. The backside illumination CMOS image sensor of claim 5, wherein a curvature of the surface of the color filter corresponds to the curvature of the at least one curved surface of the photodiode.

* * * * *